United States Patent [19]

Donaghey

[11] 4,234,353

[45] Nov. 18, 1980

[54] PROCESS FOR PREPARING PHOTOVOLTAIC CELLS HAVING INCREASED ADHESION OF THE SEMI-CONDUCTING LAYER AND PRODUCED THEREBY TO THE CONDUCTING LAYER

[75] Inventor: Lee F. Donaghey, Berkeley, Calif.

[73] Assignee: Chevron Research Company, San Francisco, Calif.

[21] Appl. No.: 27,979

[22] Filed: Apr. 9, 1979

Related U.S. Application Data

[63] Continuation of Ser. No. 887,081, Mar. 16, 1978, abandoned.

[51] Int. Cl.$^2$ .................. H01L 31/06; B05D 5/12
[52] U.S. Cl. ............................ 136/258; 29/572; 357/30; 357/59; 427/74
[58] Field of Search ........ 136/89 TF, 89 CD, 89 CC; 427/74; 29/572; 357/30, 59

[56] References Cited

U.S. PATENT DOCUMENTS

| | | | |
|---|---|---|---|
| 3,271,637 | 9/1966 | Webb et al. | 357/63 |
| 3,914,856 | 10/1975 | Fang | 29/572 |
| 4,086,101 | 4/1978 | Jordan et al. | 136/89 CD |
| 4,095,006 | 6/1978 | Jordan et al. | 427/427 |
| 4,159,914 | 7/1979 | Jordan et al. | 136/89 TF |

*Primary Examiner*—Aaron Weisstuch
*Attorney, Agent, or Firm*—D. A. Newell; S. R. LaPaglia; J. Stoner, Jr.

[57] ABSTRACT

Improved adhesion of the semi-conducting layer to the conducting layer in a thin film photovoltaic cell is obtained by incorporating a minor amount of the element or elements of the conducting layer in the semi-conducting layer.

7 Claims, No Drawings

PROCESS FOR PREPARING PHOTOVOLTAIC CELLS HAVING INCREASED ADHESION OF THE SEMI-CONDUCTING LAYER AND PRODUCED THEREBY TO THE CONDUCTING LAYER

This is a continuation of application Ser. No. 887,081, filed Mar. 16, 1978, now abandoned.

BACKGROUND OF THE INVENTION

This invention concerns improved thin film photovoltaic cells and their preparation. In particular, this invention concerns an improved thin film photovoltaic cell having significantly increased adhesion between the semi-conducting and conducting layers. The increased adhesion is obtained by incorporating minor amounts of the conducting element in the semi-conducting layer.

Thin film photovoltaic cells prepared from elemental and compound semi-conductors are well known. For example, photovoltaic cells based on silicon, gallium arsenide, and cadmium sulfide have been prepared from single crystals. However, in order to economically obtain thin film polycrystalline photovoltaic cells from these semi-conductive materials, technical improvements in the fabrication process are still necessary. Accordingly, a great deal of research effort has been expended on their development and improvement. For instance, U.S. Pat. No. 2,820,841 granted to Carlson et al on Jan. 21, 1958 describes the fabrication of a typical thin film polycrystalline cadmium sulfide photovoltaic cell. In general, the cadmium sulfide cells comprise a substrate, a conducting electrode layer, a semi-conducting polycrystalline cadmium sulfide layer, a photovoltaic barrier layer containing a group IB metal, and a collecting electrode layer. The interfacial contact between the semi-conducting layer and the barrier layer forms a photovoltaic junction. It is believed that this junction is of the P-N type and that the mechanism of photovoltaic generation involves the formation of electron-hole pairs in the semi-conducting layer in response to the action of incident radiation having absorbable wavelengths. The charge carriers diffuse from the semi-conducting layer across the junction, creating a potential difference which in turn causes an electrical current to flow through an external circuit completed by the collecting and conducting electrodes.

Various deposition processes have been shown to be useful in forming semi-conducting thin films suitable for use in photovoltaic cells. Suitable processes include physical deposition, chemical vapor deposition, spray pyrolysis deposition, and electrodeposition. Physical deposition is carried out by collecting vaporized elemental or salt forms of the material to be deposited on a substrate to form a thin film. Chemical deposition uses a vapor phase reaction to deposit a thin film on a substrate. Spray pyrolysis is carried out by spraying a solution of the material to be deposited on a heated substrate. Electrodeposition relies on an electrochemical reaction in a solution of the material to be deposited to produce a thin film. Each of these deposition processes is well known. For instance, U.S. Pat. No. 3,880,633 granted to Jordan et al on Apr. 29, 1975 describes a method of continuously fabricating cadmium sulfide photovoltaic cells. According to this method, a conducting layer of tin oxide and a semi-conducting layer of cadmium sulfide are applied to a floating plate of glass by spray pyrolysis deposition. The conducting layer is formed by spraying a solution of tin chloride, reactants, and dopants on the heated glass substrate. A similar conducting layer can be obtained by substituting indium chloride for tin chloride. Similar conducting layers can be obtained by sputter deposition or by chemical vapor deposition. In the Jordan process, the semi-conducting layer is formed by spraying an aqueous solution of cadmium chloride and N,N-dimethylthiourea over the tin oxide layer.

Thus, in the usual arrangement of layers comprising typical thin film photovoltaic cells a glass or metallic substrate is first coated with a conducting layer. Then a polycrystalline semi-conducting layer is deposited. Regardless of the process used to deposit these layers, it is important that there is good adhesion between the conducting layer and the semi-conducting layer in order to maintain a low series resistance through the cell and to give the cell long-term thermal stability.

Accordingly, it would be advantageous to provide a method for improving the adhesion between the conducting and semi-conducting layers. Various materials, such as dopants, have been suggested for inclusion in the semi-conducting layer. Dopants are described in the art as materials which can be added to the semi-conducting layer to reduce the resistivity of the layer thereby increasing the efficiency of the cell. Materials comprising indium, gallium, and aluminum have been used as dopants to darken the cadmium sulfide semi-conducting layer making it more light absorbent in the red end of the spectrum. Preferably the dopant is applied to the semi-conducting layer. However, dopants can be applied simultaneously with the semi-conducting layer. It would be particularly advantageous to provide a method for improving the adhesion of the conducting and semi-conducting layer which also provides the advantages of a dopant.

SUMMARY OF THE INVENTION

It has been found that the adhesion of the conducting layer to the semi-conducting layer of a polycrystalline thin film photovoltaic cell can be significantly improved by incorporating a minor amount of the conducting element in the semi-conducting layer. It has also been found that by selecting as the conducting element a material which is also used as a dopant the process of this invention can be used to reduce the semi-conducting layer's resistivity as well as increasing its adhesion to the conducting layer.

DETAILED DESCRIPTION OF THE INVENTION

The preparation of thin film photovoltaic cells is well known. U.S. Pat. Nos. 3,148,084 to Hill et al; 2,695,247 to Junge; 2,522,531 to Mochel; and 3,880,633 to Jordan et al describe various aspects of chemical spray deposition used to form photoconductive or transparent conductive articles. In particular, U.S. Pat. No. 3,880,633 (incorporated herein by reference) describes the use of a series of spray depositions to apply the layers making up a cadmium sulfide photovoltaic cell.

Among other factors, the present invention is based upon the discovery that by incorporating minor amounts of the conducting element of the conducting layer of a thin film polycrystalline photovoltaic cell in the semi-conducting layer, the adhesion of the semi-conducting layer to the conducting layer is significantly improved. Thus, this invention relates to an improved process for preparing thin film polycrystalline photovoltaic cells.

The amount of conducting element which, when incorporated into the semi-conducting layer provides improved adhesion, can vary over a wide range. In general, at least 0.0001 mol of conducting element per mol of the metallic or major component of the semi-conducting layer is required, at least 0.001 mol of conducting element per mol of metal or major component of the semi-conducting layer is preferred, and from 0.0001 to 0.01 mol of conducting element per mol of metal or major component of the semi-conducting layer is an especially preferred range. The metallic or major component of the semi-conducting layer is, of course, determined by the choice of semi-conductor. For instance, cadmium is the metallic or major component of a thin film cadmium sulfide or cadmium telluride photovoltaic cell, indium is the metallic or major component of an indium phosphide photovoltaic cell, and cadmium and zinc are the metallic or major components of a cadmium-zinc sulfide photovoltaic cell.

The choice of conducting element is of course determined by the choice of material used as the conducting layer. In general, where the cell comprises a glass or metallic substrate, a transparent, chemically inert, thermally stable material can be used as the conducting layer. Typical conducting layers comprise zinc oxides, tin oxides, indium oxides, gallium oxides, or combinations of these materials, such as cadmium-tin oxide. Furthermore, conducting layers comprising a metal or metal alloy are also contemplated. As used herein the term "conducting element" refers to the cationic element of the conducting material. Thus, conducting elements typically include tin, indium, and gallium. These materials are generally deposited by the same processes used to deposit the semi-conducting layer. For instance, by physical, chemical, pyrolytic or electrochemical deposition.

The advantages of this invention are obtained by incorporating a minor amount of the conducting element in the semi-conducting layer which is applied in interfacial contact with the conducting layer. For instance, by adding a minor amount of a soluble salt of the conducting element to the semi-conducting spray solution of spray deposition, the conducting element can be incorporated in the semi-conducting layer.

In a typical process for preparing polycrystalline thin film photovoltaic cells several conducting elements have been added to the semi-conducting layer as dopants to reduce the internal resistivity of the semi-conducting layer. However, prior to this invention the choice of dopant has not been observed to affect the adhesion of the conducting and semi-conducting layers. In fact, most processes prefer to apply the dopant as a separate layer by successive application of the semi-conducting layer and the dopant. For instance, U.S. Pat. No. 3,880,633 describes the preparation of a cadmium sulfide cell having a tin oxide conducting layer in contact with a cadmium sulfide semi-conducting layer doped with aluminum. In accordance with this invention, by judiciously selecting the conducting element as a dopant and incorporating it into the semi-conducting layer it is possible to reduce the internal resistance of the semi-conducting layer while simultaneously improving adhesion to the conducting layer. In this embodiment of the invention the amount of conducting element which is incorporated in the semi-conducting layer is dependent upon the desired degree of "doping", but should be at least 0.0001 mol per mol of the metallic or major component of the semi-conducting layer.

EXAMPLES

The following comparative examples further illustrate the advantages of the present invention and will suggest other embodiments to those familiar with the preparation of photovoltaic articles. Examples IV and VI illustrate practice of the present invention; while Examples I, II, III and V illustrate, for comparative purposes, conventional methods of cell preparation.

EXAMPLE I

A piece of plate glass which had previously been coated with a transparent film of tin oxide-doped $In_2O_3$ was cleaned and heated to 450° C. A solution containing 0.039 mole per liter of thiourea and 0.032 sole per liter of $CdCl_2$ was then sprayed onto the coated surface of the glass plate at a spray rate of 0.8 cm$^3$ of solution per hour per cm$^2$ of plate glass area for 80 minutes. The glass plate was then cooled at the rate of 7.5° C. per minute at room temperature.

The adhesion of the resulting cadmium sulfide film to the coated glass plate was measured by two methods. In the first method, a single-edged razor blade was used to scrape the film surface while the force required to remove the cadmium sulfide film from the coated glass was measured. In the second method, a weighted surgical knife was used to scrape the film surface while the critical normal force on the knife needed to remove the cadmium sulfide film from the coated glass was measured.

The adhesion tests showed that the relative adhesive strength of the cadmium sulfide film was very low.

EXAMPLE II

A piece of coated plate glass was coated with a cadmium sulfide film in the same manner as described in Example I, except that the spray solution contained 0.008 mole per liter of $AlCl_3$ in addition to 0.044 mole per liter of thiourea and 0.024 mole per liter of $CdCl_2$. The relative adhesive strength of the cadmium sulfide film to the coated glass was found to be moderate-low.

EXAMPLE III

A piece of coated plate glass was coated with a cadmium sulfide film in the manner as described in Example II, except that the glass temperature during deposition of the cadmium sulfide was 450° C.

The relative adhesive strength of the cadmium sulfide film to the coated glass was found to be moderate-high.

EXAMPLE IV

A piece of coated plate glass was coated with a cadmium sulfide film in the manner as described in Example III, except that the spray solution contained 0.00032 mole per liter of $InCl_3$ in addition to thiourea, $CdCl_2$, and $AlCl_3$.

The measured adhesive strength between the cadmium sulfide film and the coated glass was found to be very high, and significantly higher than that obtained in Example I.

EXAMPLE V

Cadmium sulfide was deposited on a piece of plate glass which had been previously coated with a transparent layer of conducting tin oxide. The cadmium sulfide was deposited in the manner as described in Example I.

The adhesive strength measured between the cadmium sulfide film and the coated glass was found to be moderately low.

EXAMPLE VI

A piece of plate glass previously coated with conducting tin oxide was coated with a cadmium sulfide film in the manner as described in Example V, except that 0.00032 mole per liter of SnCl$_4$ was added to the spray solution.

The measured adhesive strength between the cadmium sulfide film and the coated glass was found to be moderately high, and quantitatively higher than that found in Experiment V.

When the cadmium sulfide semi-conducting layer of the cells fabricated in Examples IV and VI is replaced by a semi-conducting layer based on indium phosphide (InP), zinc phosphide (Zn$_2$P$_3$), cadmium-zinc sulfide (Cd$_x$Zn$_{1-x}$S), copper indium selenide (CuInSe$_2$), or other semi-conductor or compound semi-conductor equivalent improvement in adhesion between the semi-conducting layer and conducting layer is obtained.

What is claimed is:

1. In a process for preparing a thin film polycrystalline photovoltaic cell which comprises deposition of a semi-conducting layer on a conducting electrode layer, the improvement which comprises increasing the adhesion of the semi-conducting layer to the conducting layer by incorporating from about 0.01 to about 0.0001 mol of the element or elements of the conducting layer per mol of metallic or major component in the semi-conducting layer.

2. A process according to claim 1 wherein the element is tin, zinc, indium, gallium, or aluminum.

3. A process according to claim 2 wherein the element is indium.

4. A process according to claim 2 wherein the element is tin.

5. A process according to claim 1 wherein the semi-conducting layer is based on cadmium sulfide.

6. An improved cadmium sulfide photovoltaic cell comprising a thin film polycrystalline cadmium sulfide semi-conducting layer on a conducting electrode layer wherein the cadmium sulfide semi-conducting layer comprises from about 0.01 to about 0.0001 mol of the element or elements of the conducting layer per mol of metallic or major component of the semi-conducting layer.

7. An improved cadmium sulfide photovoltaic cell according to claim 6 wherein said element is tin, zinc, indium, gallium, or aluminum.

* * * * *